United States Patent

Akao et al.

Patent Number: 5,097,288
Date of Patent: Mar. 17, 1992

[54] IMAGE FORMING APPARATUS WITH A THERMAL FIXING DEVICE

[75] Inventors: Michitoshi Akao, Nagoya; Tokunori Kato, Ichinomiya, both of Japan

[73] Assignee: Brother Kogyo Kabushiki Kaisha, Nagoya, Japan

[21] Appl. No.: 545,582

[22] Filed: Jun. 29, 1990

[30] Foreign Application Priority Data

Jul. 11, 1989 [JP] Japan .................. 1-179798

[51] Int. Cl.⁵ ............................................ G03B 27/32
[52] U.S. Cl. ...................................... 355/27; 355/30; 355/77
[58] Field of Search ............... 355/27, 28, 30, 285, 355/286, 287, 288, 77; 219/216; 430/138

[56] References Cited

U.S. PATENT DOCUMENTS

| | | | |
|---|---|---|---|
| 4,367,037 | 1/1983 | Nishikawa | 355/285 |
| 4,609,278 | 9/1986 | Taniguchi | 355/285 |
| 4,827,356 | 5/1989 | Yamamoto et al. | 358/302 |
| 4,864,356 | 9/1989 | Asano et al. | 355/30 |

FOREIGN PATENT DOCUMENTS 0106059 4/1989 Japan .................. 355/30

*Primary Examiner*—Brian W. Brown
*Assistant Examiner*—Khanh Dang
*Attorney, Agent, or Firm*—Oliff & Berridge

[57] ABSTRACT

An image forming apparatus has a thermal fixing device having a first thermistor in the thermal fixing device for detecting the temperature in the thermal fixing device and a second thermistor being substantially at the center of the apparatus out of the thermal fixing device for detecting the temperature in the apparatus. In the image forming apparatus, the temperature detected by the second thermistor is compared with two predetermined reference temperatures T1 and T2 (T1<T2) repectively. The thermal fixing device is thermally controlled by the first thermistor based on a first preset current IA of the device when the temperature detected by the second thermistor is lower than the reference temperature T1 and controlled by the first thermistor based on a second preset current IB (IB<IA) preset in the device when the temperature detected by the second thermistor is in the range between T1 and T2, and further controlled so as to stop heating of the device when the temperature detected by the second thermistor is higher than the reference temperature T2. By such an image forming apparatus, the temperature both inside and outside the fixing device can be constantly controlled and, therefore, sensitivity change of the photosensitive and pressure sensitive medium used in image forming can be prevented so as to be able to stably form the image on the medium. At the same time, a warm-up time can be shortened by applying initially higher current to the heating device, which current is then lowered for steady state control.

13 Claims, 4 Drawing Sheets

IMAGE FORMING APPARATUS WITH A THERMAL FIXING DEVICE

BACKGROUND OF THE INVENTION

1. Field of the Invention

The present invention relates to an image forming apparatus and specifically relates to the temperature control of a thermal fixing device After developing a latent image optically formed on the photo sensitive and pressure sensitive recording medium on the developer sheet by pressing the recording medium and developer sheet superimposed on each other, the image forming apparatus of this invention promotively forms the image by heat fixing in the thermal fixing device.

2. Description of Related Art

As described in U.S. Pat. No. 4,827,356, an image forming apparatus using a photo sensitive and pressure sensitive recording medium and a developer sheet has a thermal fixing means, a temperature detection means to detect the temperature in the thermal fixing means, and control means to control the temperature of the thermal fixing means based on the signal detected by the temperature detection means. The image forming apparatus is controlled so as to keep the temperature in the thermal fixing means substantially at a preset temperature.

However, the temperature in the image forming apparatus rises when energized for a long time because the thermal fixing means is installed in the image forming apparatus. As a result, the sensitivity of the photo sensitive and pressure sensitive recording medium in the apparatus changes. Thus, the following problem exists when the image is formed in the above-mentioned situation. There is a difference between the color of the output image formed based on the above-mentioned condition and the color of the image output at the normal temperature condition. A similar problem arises in other image forming apparatus as well in that continued exposure to high temperature can have a degrading effect on other recording media such as ordinary paper.

Furthermore, temperature control of the fixing means is typically based upon duty control of a fixed current heating device. The current value is chosen to optimize the control characteristic for steady state operation, e.g., to minimize fluctuation about a target temperature inside the fixing device and to avoid temperature rises above a certain level outside the fixing device. However, an optimum current value for steady state operation is not optimum for a start up condition when it is desirable to warm up the fixing device to its operating temperature with minimum delay. Thus, a warm up time is undesirably lengthened.

SUMMARY OF THE INVENTION

To solve the problems mentioned above, this invention was made. An object of the present invention is to provide an image forming apparatus to prevent the temperature in the apparatus from unnecessarily rising by using a second temperature detection device to detect the temperature in the image forming apparatus, and to thereby offer an image with a stable color. A further object of the invention is to provide an image forming apparatus with a thermal fixing device which is able to warm up to an operating temperature with minimum delay and to optimize temperature control for steady state operation.

To achieve these objects, the image forming apparatus of this invention has, in one aspect, the second temperature detection means to detect the temperature in the apparatus outside of the thermal fixing means. When the second temperature detection means detects the temperature in the image forming apparatus rising above a first level, the control means reduces the heating energy supplied to the thermal fixing means. When this temperature rises above a second temperature level, the thermal fixing device is turned off.

As mentioned above, because the temperature in the apparatus can always be maintained below a constant temperature by detecting the temperature in the apparatus and controlling the temperature of the thermal fixing means, the change of the sensitivity of the photo sensitive and pressure sensitive recording medium by the rise of the temperature is prevented and an image with a stable color can be obtained according to this invention. Additionally, a warm up time of the thermal fixing device is decreased while maintaining optimum control for steady state operation.

The above and further objects and novel features of the invention will more fully appear from the following detailed description when the same is read in connection with the accompanying drawings. It is to be understood, however, that the drawings are for purpose of illustration only and are not intended as a definition of the limits of the invention.

BRIEF DESCRIPTION OF THE DRAWINGS

A preferred embodiment of the present invention will be described in detail with reference to the following figures wherein.

DESCRIPTION OF THE PREFERRED EMBODIMENT

Figure 5:
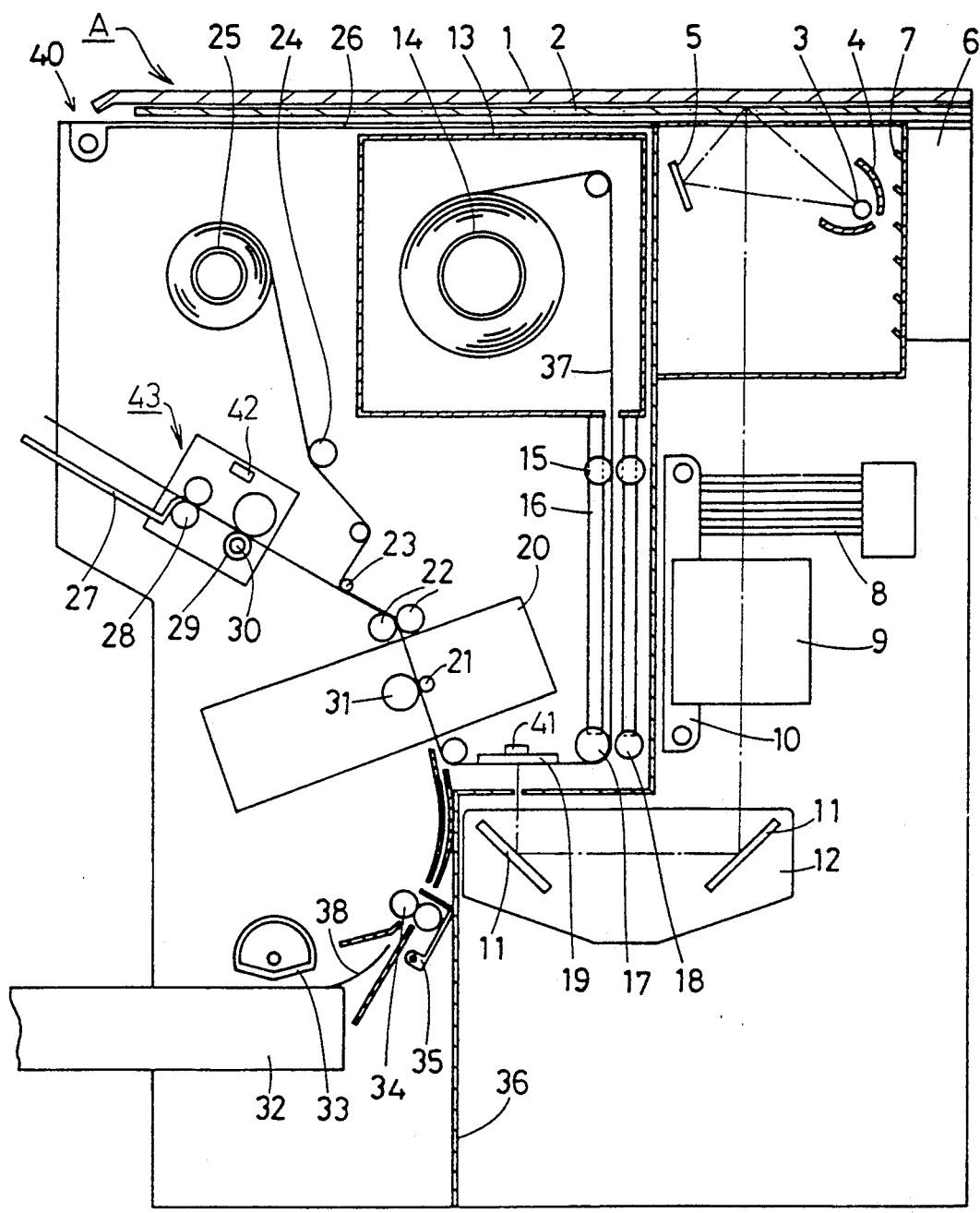
FIG. 5 is a schematic front sectional view of the image forming apparatus embodying this invention.

Hereinafter, an embodiment of the present invention will be described referring to the drawings. FIG. 5 is a schematic front sectional view of a copier using the photo sensitive and pressure sensitive sheets which enable copying in full color. The sensitive sheets consisting of microcapsule paper and the developer sheet which enable such a copy are known and thus not fully explained here. See, e.g., Japanese Patent Laid-Open No. 88739/1983.

As shown in FIG. 5, a copier 40 which uses the photo sensitive and pressure sensitive sheet constitutes a manuscript stand glass 2 and a manuscript stand cover 1 as an upper plate which moves to the right and left during a copying operation. The manuscript can be put on the manuscript stand glass 2 to copy the image on the face-down side. A light source which constitutes a halogen lamp 3 arranged in a direction normal to the direction where the stand glass 2 moves and a reflector 4 of semicylindrical shape arranged to surround it, are on the right upper side of the copier 40. The light source radiates light directly at the manuscript stand glass 2.

Therefore, the light radiated from the halogen lamp 3 can radiate the front side of the manuscript stand glass 2 from the left end to the right end as the upper plate moves. The light radiated from the light source and passed through the transparent manuscript stand glass 2 is reflected by the face-down side of the manuscript put on the manuscript stand glass 2. The manuscript stand cover 1 which covers the upper surface of the manuscript stand glass 2 is provided in order that this radiating light should not escape outside of the manuscript.

Moreover, a reflector 5 is provided at the left of the lighting source so that the light from the halogen lamp 3 radiates the manuscript efficiently. Light which does not directly face the manuscript is reflected by the reflector 5 and is used for radiating of the manuscript again.

A fan 6 which takes air from the outside and a louver 7 are provided at the right of the halogen lamp 3. Therefore, air is efficiently applied to the manuscript stand glass 2. The light radiated from the halogen lamp 3 and reflected by the manuscript located on the manuscript stand glass 2 enters a lens 9 through a filter 8. The filter 8 changes the light transmission characteristic according to the characteristic of the sensitivity of a microcapsule sheet 37 and adjusts the tone of the copy image. The lens 9 is installed on a lens installation board 10 and a slight adjustment of the installation angle of the lens to the light path is possible.

The path direction of light collected by the lens 9 is turned about 180° by the reflection mirrors 11,11 and is radiated on the microcapsule sheet 37. And, the latent image is formed on the microcapsule sheet 37 located closely under an exposure stand 19. The reflection mirrors 11,11 are fixed to a mirror installation board 12. The length of the light path and the focus are slightly adjustable by the installation position of the mirror installation board 12. Moreover, a thermistor 41 which detects the temperature in the copier 40 is installed at an upper position of the exposure stand 19. The installed position of the thermistor 41 is at the approximate center of the copier 40.

On the other hand, the microcapsule sheet 37 is accommodated in a cartridge 13 which is detachable. The sheet 37 is rolled around a cartridge axis 14 of the cartridge 13 which is provided under the manuscript stand glass 2. One edge of the microcapsule sheet 37 is passed through a number of rollers and a pressure development device 20 and wound around a winding shaft 25.

That is, the microcapsule sheet 37 which goes out of the lower side of the cartridge 13 is led into a feeding roller 15, a barrel-shaped roller 17, and a feeding roller 18 and is supplied to the pressure development device 20 after passing under the exposure stand 19. Afterwards, the microcapsule sheet 37 which passes the pressure development device 20 is wound up around the winding shaft 25 after being led into a peel roller 23 and a meander adjusting roller 24. The microcapsule sheet 37 coming through the cartridge 13 remains unexposed by means of a light shielding member 16. And, a partition plate 36 is set up in order to shield light from a developer part described hereinafter.

The transportation speed of the microcapsule sheet 37 is constantly controlled by drive rollers 22. Moreover, because the above-mentioned transportation speed corresponds to the moving speed of the manuscript stand glass 2, the latent image is formed successively on the microcapsule sheet 37 when the microcapsule sheet 37 passes the exposure stand 19.

Moreover, under the pressure development device 20, a developer sheet cassette 32 which stores a developer sheet 38 of the cut paper type is installed. The developer sheet 38 is taken out from the cassette 32 one by one by a semi circular roller 33 and is transported to the sheet inlet of the pressure development device 20 after the top end portion of the developer sheet 38 is aligned by a developer sheet feeding roller 34 and a registration gate 35.

Therefore, the microcapsule sheet 37 closely contacts with the developer sheet 38. And, it is supplied to the pressure development device 20 all together. The pressure development device 20 is constituted by a small diameter roller 21 and a backup roller 31 located directly upstream from where the microcapsule bearing side of the microcapsule sheet 37 upon which the latent image is formed and the side of the developer sheet 38 where a color agent is spread come in contact with each other. After such contact, the combined microcapsule sheet 37 and the developer sheet 38 can be nipped between the small diameter roller 21 and the backup roller 31 where pressure is applied. Non-exposed microcapsules are erupted by pressing force yielded between the rollers 21 and 31 and the image is formed on the developer sheet 38.

The microcapsule sheet 37 and the developer sheet 38 which leave the pressure development device 20 are transported by the drive rollers 22. The microcapsule sheet 37 advances toward the upper direction. On the other hand, the developer sheet 38 advances directly while peeling by the peel roller 23, and both are separated. After the image formation is promoted by a thermal fixing device 43 and the image is completed, the developer sheet 38 is discharged onto a tray 27 with the image side face-up. The thermal fixing device 43 constitutes a heat roller 29 which has a heater 30 internally and a developer sheet feeding roller 28. A thermistor 42 which detects the temperature in the thermal fixing device 43 is installed in an upper portion of the thermal fixing device 43. The separated microcapsule sheet passes the meander adjusting roller 24 and is rolled in the winding shaft 25.

The function of the apparatus which is constituted as described above is explained below.

First, the manuscript stand cover 1 is opened and the manuscript is set on the manuscript stand glass 2. After that, the manuscript stand glass 2 moves right when a start button (not shown) is pressed. The left end of the manuscript stand glass 2 stops in the position opposite to the light source. Afterwards, the manuscript stand glass 2 is moved left while lighting of the halogen lamp 3 is directed thereto. The light radiated from the halogen lamp 3 is reflected by the manuscript. After that, the reflected light from the manuscript is transmitted through the filter 8, the lens 9, reflected by mirrors 11,11 and focused on the microcapsule sheet 37 under the exposure stand 19. At this time, the microcapsule sheet 37 is moved left on the exposure stand 19 at the same speed as the move speed of the manuscript stand glass 2. Therefore, the image in the manuscript is formed on the microcapsule sheet 37 as the latent image.

The manuscript stand glass 2 moves left and the developer sheet 38 is taken out of the developer sheet cassette 32 by the semi circular roller 33. After that, the developer sheet 38 is overlapped with the exposed microcapsule sheet 37 and is supplied to the pressure development device 20. Then, the latent image on the microcapsule sheet 37 is developed and transcribed on the developer sheet 38.

Afterwards, the developer sheet 38 is discharged out of the copier 40 after the image is thermally fixed on the developer sheet 38 by the thermal fixing device 43. On the other hand, the microcapsule sheet 37 which passes the pressure development device 20 is wound around the winding shaft 25 continuously. When the manuscript stand glass 2 moves to the position where the right end thereof is opposite to the light source, the copy of the manuscript is completed and the halogen lamp 3 is turned off.

Next, the temperature control of the thermal fixing device of this invention is explained based on FIGS. 1, 2, 3 and 4.

Figure 1:
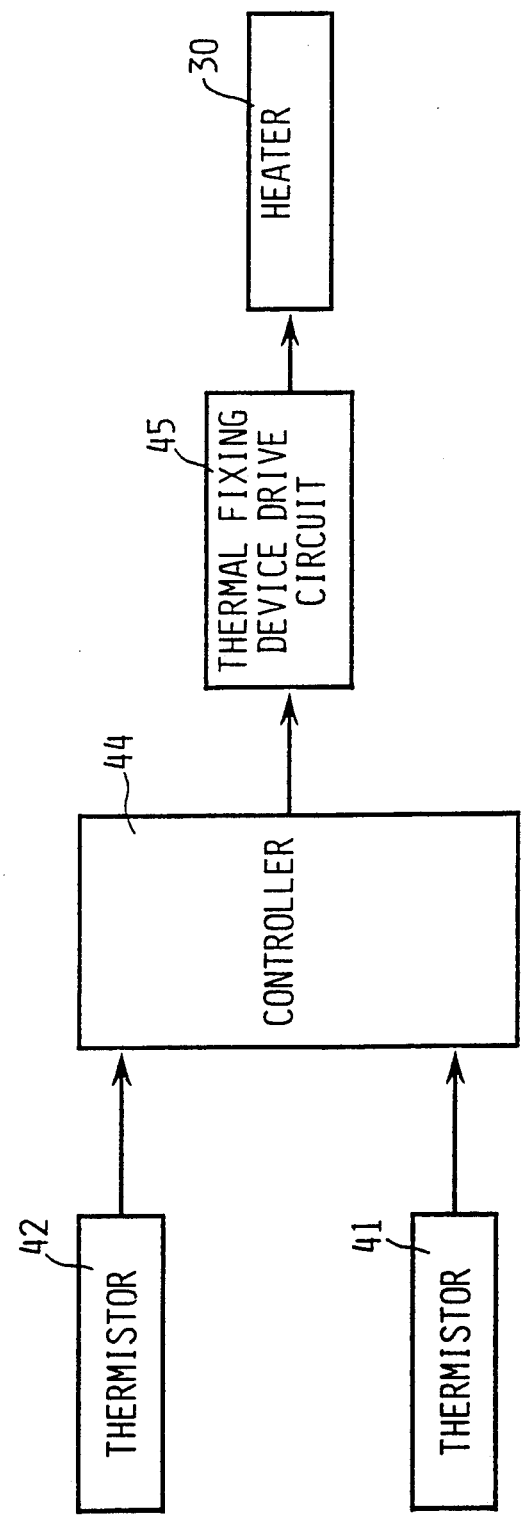
FIG. 1 is a block diagram showing the controller of the thermal fixing device in the image forming apparatus embodying this invention.

FIG. 1 is a block diagram of the temperature control device of the thermal fixing device. Each of thermistor 41 in the image forming apparatus and the thermistor 42 in the thermal fixing device 43 is connected to a controller 44. This controller 44 receives the detection signals of the thermistors 41 and 42. And, a thermal fixing device drive circuit 45 and the heater 30 are driven and controlled based on this signal. The thermistor 41 detects the temperature in the image forming apparatus outside of the thermal fixing device 43 and outputs the detection signal to the controller 44. The thermistor 42 detects the temperature in the thermal fixing device 43 and outputs a detection signal to the controller 44.

Figure 2:
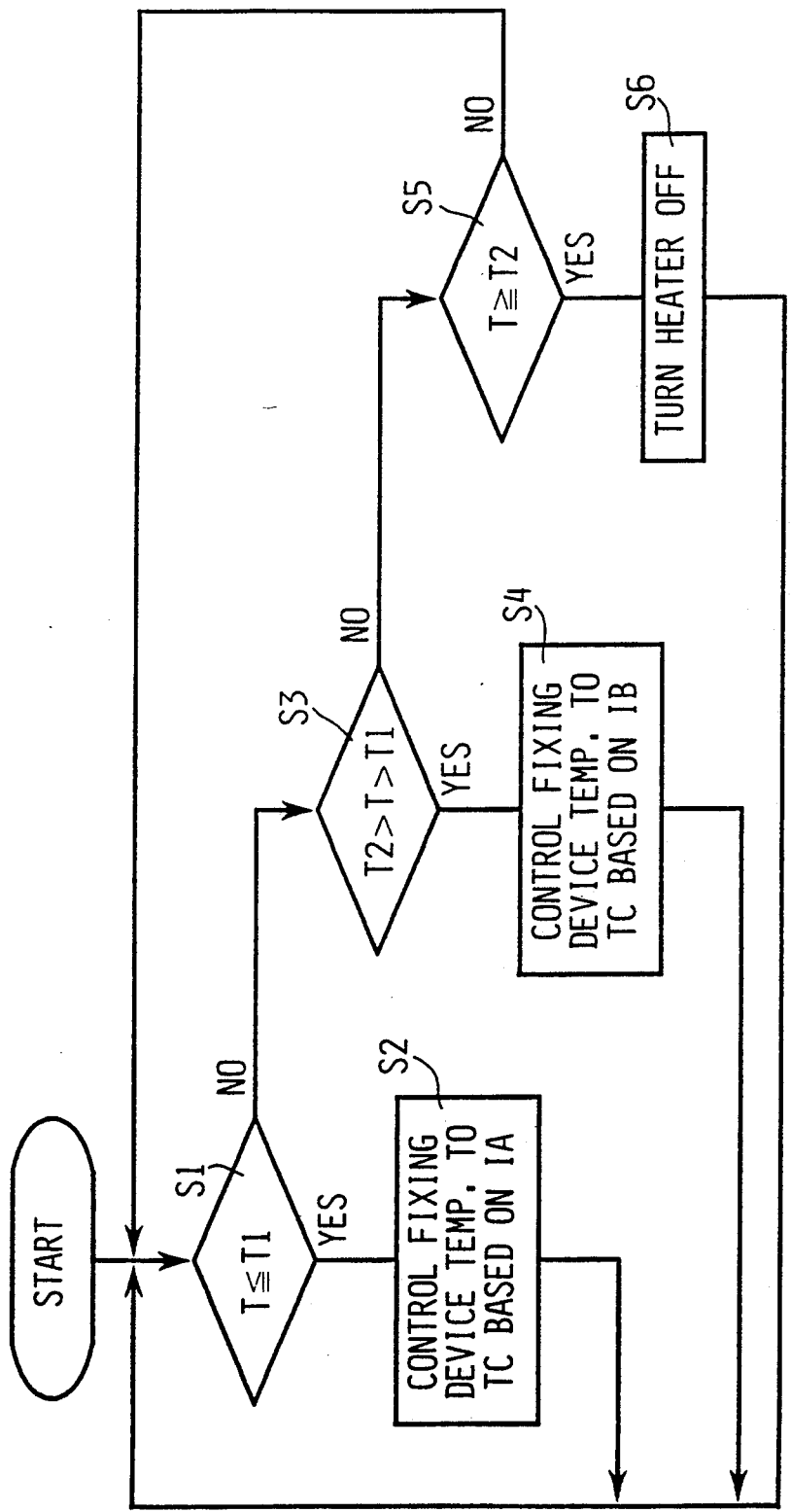
FIG. 2 is a flowchart showing temperature control processing in the thermal fixing device.

The continuous temperature control is explained based on the control flowchart shown in FIG. 2.

First, the thermistor 41 judges if temperature T in the image forming apparatus is lower than a predetermined temperature T1 in STEP 1 (hereinafter, abbreviated as S1).

If the result judged in S1 is YES (as would be the case in a start-up condition), the temperature of the thermal fixing device 43 is controlled via the thermistor 42 in S2 based on a preset command temperature TC set beforehand for the heater 30 and a preset current level IA. That is, the thermal fixing device drive circuit 45 turns on the heater 30 with current IA when the temperature in the thermal fixing device 43 detected by the thermistor 42 is lower than the preset temperature TC and would turn off the heater 30 if the temperature in the thermal fixing device 43 rose higher than the command temperatures TC. Thus, the temperature in the thermal fixing device 43 is initially controlled by the drive circuit 45 using current IA to bring the temperature in the thermal fixing device 43 up to the preset temperature TC. Typically, on-off control will not occur based upon current IA. Rather, IA will be used only during an initial start-up period when IA is continuously applied, as will be apparent from the following description.

Figure 3:
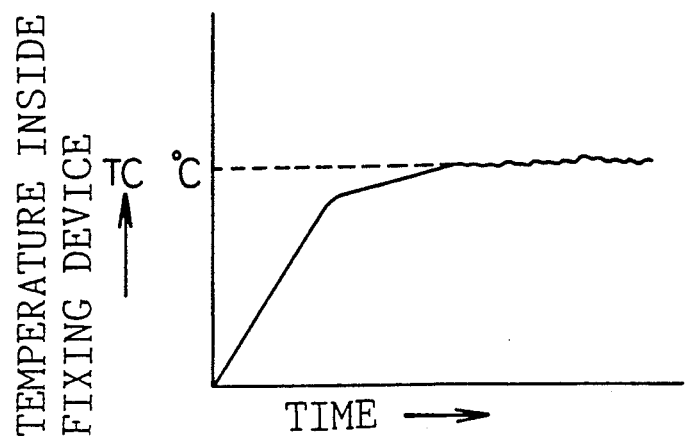
FIG. 3 is a graph showing functionally the temperature controlling state of the thermal fixing device.

FIG. 3 is a graph where the above-mentioned initial control state as well as subsequent steady state control are shown. More specifically, the relation between time and temperature inside the fixing device is shown.

It can be seen that the heater 30 is initially heated by uninterrupted application of current value IA to attain the command temperature TC of the heater 30. This continues until temperature T in the image forming apparatus detected by the thermistor 41 becomes equal to a temperature T1 which is set beforehand.

In this case, the result judged in S1 is NO, and in S3, the temperature T in the image forming apparatus is judged by the thermistor 41 to see whether the temperature T is lower than another predetermined temperature T2 higher than T1.

If the result judged in S3 is YES, control of the heater 30 to temperature TC based upon IB (IB<IA) is performed. Thus, the temperature of the thermal fixing device 43 is controlled same as before but based on the current IB newly set in S4. As can be seen in FIG. 3, the temperature gradient is much less with IB applied as compared with IA. When temperature TC is attained, on-off control of the heater is initiated to maintain approximately TC.

On the other hand, if the result judged in S3 is NO, the temperature T in the image forming apparatus is judged via the thermistor 41 in S5 to see whether the temperature T is higher than the predetermined temperature T2.

If the result judged in S5 is YES, the heater 30 is turned off in S6. On the other hand, if the result judged in S5 is NO, the process flow returns to S1.

Figure 4A:
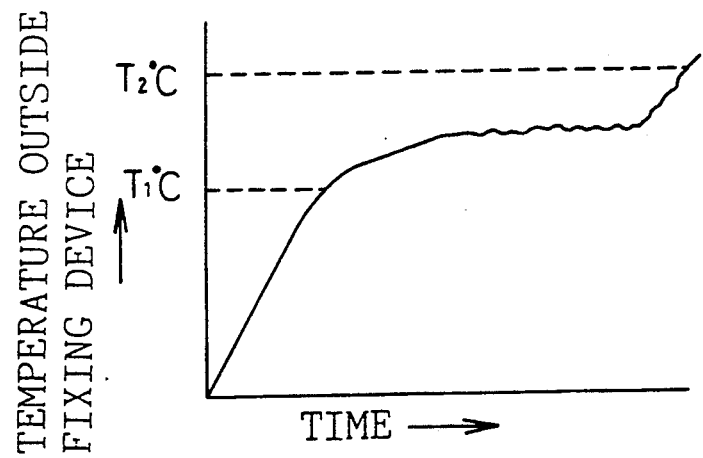
FIGS. 4 (A) and (B) are graphs showing functionally the temperature controlling state in the apparatus but outside the thermal fixing device and the current applied to the thermal fixing device to maintain command temperature TC.
Figure 4B:
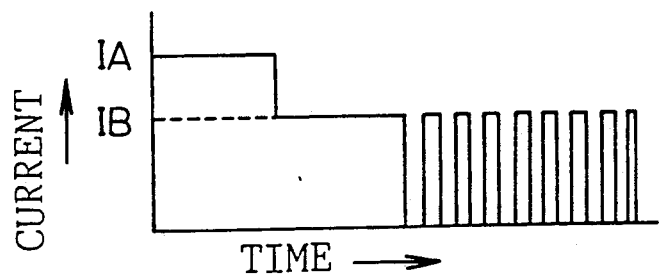

FIG. 4(A) is a graph where the relation between time and temperature is shown, similar to FIG. 3, except the temperature is that within the image forming device but outside the fixing device 43. FIG. 4(B) is a graph showing the relation between time and current applied to the heater 30 of the thermal fixing device.

The following can be understood from both graphs. The heater 30 is heated by current value IA to maintain the preset command temperature TC of the heater 30 (as shown in FIG. 3) until temperature T in the image forming apparatus detected by the thermistor 41 exceeds the temperature T1 which is set beforehand. When the temperature T is in the range between the temperatures T1 and T2, the heater 30 is heated by current value IB lower than IA to maintain the command temperature TC. In addition, if the temperature T becomes T2 or more, heater 30 is turned off. Such a condition indicates an over-heat condition when the temperature inside the image forming device has risen to such a level as to cause sensitivity changes to the photosensitive pressure sensitive sheet. The heater 30 remains off until the temperature T sensed by thermistor 41 is reduced to an acceptable level (below T2). Copying is not allowed while T2 is exceeded since the command temperature TC cannot be maintained with the heater 30 in an off state. The possibility of an overheat condition is lessened by use of a lower current value IB for maintaining steady state temperature control of the thermal fixing device, yet by using higher current IA initially, warm-up speed is not sacrificed.

This invention is not limited to the above-mentioned embodiment but can be applied to provide a control which varies the current to the fixing device heater 30 among more then two levels based upon the temperature in the apparatus but outside the fixing device. Alternatively, a voltage rather than a current applied to heater 30 may be varied, or the heating energy applied to the heater might be varied otherwise. Additionally, the invention is not limited to an image forming apparatus using a photosensitive pressure sensitive sheet. The advantages of the invention may be realized in other copying arrangements where excessive operating heat may have a degrading effect on a recording medium or other components housed within the machine.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An image forming apparatus comprising:
   an enclosure;
   means for defining a path of travel of a photosensitive, pressure sensitive image recording medium in the enclosure;
   means for forming a latent image on the recording medium, said image forming means being located at an image forming station located within the enclosure and along the path of travel of the recording medium;
   means for defining a path of travel of a developer sheet within the enclosure;
   means for effecting formation of an image on the developer sheet from the latent image on the recording medium, said means for effecting image formation on the developer sheet being located along the paths of travel of the recording medium and developer sheet and downstream of the image forming station;
   thermal fixing means for fixing an image on the developer sheet, the thermal fixing means being located downstream of the image effecting means;
   heating means associated with the thermal fixing means for supplying heat to fix an image on the developer sheet;
   a temperature detection means, arranged in the image forming apparatus upstream of the means for effecting image formation on the developer sheet, for detecting a temperature in said apparatus upstream of said means for effecting image formation; and
   a control means for controlling heating energy applied to the heating means in the thermal fixing means based on a detection signal output from the temperature detection means.

2. An image forming apparatus as claimed in claim 1, wherein the temperature detection means is arranged centrally within the image forming apparatus.

3. An image forming apparatus as claimed in claim 1, wherein the temperature detection means comprises a thermistor.

4. An image forming apparatus as claimed in claim 1, wherein the control means controls the heating energy of the heating means based on the result of a comparison of the temperature detected by the temperature detection means with a preset temperature.

5. An image forming apparatus as claimed in claim 1, further comprising another temperature detecting means arranged in the thermal fixing means for detecting the temperature in the thermal fixing means, wherein the control means controls the heating means so as to be heated based on the result of comparing the temperature in the thermal fixing means detected by the another temperature detection means to a predetermined control temperature, until the temperature in said apparatus upstream of said means for effecting image formation detected by the temperature detection means exceeds a preset value, whereupon the heating means is turned off.

6. An image forming apparatus as claimed in claim 5, wherein the another temperature detection means comprises a thermistor.

7. An image forming apparatus as claimed in claim 4, further comprising another temperature detection means arranged in the thermal fixing means for detecting the temperature in the thermal fixing means, and wherein the control means also controls the heating means based on the result of comparing the temperature in the thermal fixing means detected by the another temperature detection means with a predetermined control temperature, to maintain the temperature of the thermal fixing means at approximately the control temperature.

8. An image forming apparatus as claimed in claim 7, wherein the control means selects one of a plurality of heating energy levels based on the comparison between the preset temperature and the temperature in said apparatus upstream of said means for effecting image formation detected by the temperature detection means and uses on-off control of the heating means to maintain approximately the control temperature.

9. An image forming apparatus as claimed in claim 1, wherein the control means reduces the heating energy applied to the heating means when the temperature detected by the temperature detection means exceeds a preset temperature.

10. A method for minimizing heat exposure of a heat sensitive image recording medium within an image forming apparatus having: means for defining a path of travel of a photosensitive, pressure sensitive image recording medium in the enclosure; means for forming a latent image on the recording medium, said image forming means being located at an image forming station located within the enclosure and along the path of travel of the recording medium; means for defining a path of travel of a developer sheet within the enclosure; means for effecting formation of an image on the developer sheet from the latent image on the recording medium, said means for effecting image formation on the developed sheet being located along the paths of travel of the recording medium and developer sheet and downstream of the image forming station; thermal fixing means for fixing an image on the developer sheet, the thermal fixing means being located downstream of the image effecting means; heating means associated with the thermal fixing means for supplying heat to fix an image on the developer sheet; the method comprising the steps of:
   detecting a temperature at a location within the enclosure upstream of the means for effecting image formation on the developer sheet, the temperature at the location being affected by the temperature of the thermal fixing means; and
   controlling heating energy applied to the heating means in the thermal fixing means, based upon the temperature detected in the detecting step.

11. A method as claimed in claim 10, wherein the heating energy is reduced when the detected temperature exceeds a preset temperature.

12. An image forming apparatus for forming an image on a developer sheet based on a latent image formed on a photo sensitive and pressure sensitive recording medium, and for fixing the image formed on the developer sheet by a thermal fixing means which has a heating means, comprising:
   a temperature detection means arranged in the image forming apparatus and outside of the thermal fixing means, for detecting temperature in the apparatus;
   a control means for controlling a heating energy applied to the heating means in the thermal fixing means based on a detection signal from the temperature detection means, wherein the control means compares the temperature detected by the temperature detection means with a preset temperature, and sets the heating energy level based on the result of comparing the temperature detected by the temperature detection means with the preset temperature;

another temperature detection means arranged in the thermal fixing means for detecting the temperature in the thermal fixing means, and wherein the control means also controls the heating means based on the result of comparing the temperature detected by the another temperature detection means with a control temperature, to maintain the heating means at approximately the control temperature;

wherein the control means selects one of a plurality of heating energy levels based on the comparison between the preset temperature and the temperature detected by the temperature detection means and uses on-off control of the heating means to maintain said heating means at approximately the control temperature; and wherein the control means compares said temperature detected by said temperature detection means with two different temperatures T1 and T2 in the apparatus and outside the thermal fixing means, the temperature T1 being less than the temperature T2, and the control means can selectively set two different current levels IA and IB of the heating means, the current level IA being greater than the current level IB, and wherein the control means heats the heating means based on the current level IA when the temperature detected by the temperature detection means is less than the temperature T1, and the control means heats the heating means based on the current level IB when the temperature detected by the temperature detection means is equal to or more than the temperature T1 and less than the temperature T2, and the control means turns off the heating means when the temperature detected by the temperature detection means is equal to or more than T2.

13. An image forming apparatus for forming an image on a developer sheet based on a latent image formed on a photo sensitive and pressure sensitive recording medium, and for fixing the image formed on the developer sheet by a thermal fixing means which has a heating means, comprising:

a temperature detection means arranged in the image forming apparatus and outside the thermal fixing means, for detecting temperature in the apparatus; and a control means for controlling a heating energy applied to the heating means in the thermal fixing means based on a detection signal output from the temperature detection means;

wherein the control means compares the temperature detected by the temperature detection means with a preset temperature, and sets the heating energy level based on the result of comparing the temperature detected by the temperature detection means with the preset temperature;

wherein the control means selects one of a plurality of heating energy levels based on the comparison between the preset temperature and the temperature detected by the temperature detection means and uses on-off control of the heating means to maintain said heating means at approximately a control temperature; and wherein the control means compares said temperature detected by said temperature detection means with two different temperatures T1 and T2 in the apparatus and outside the thermal fixing means, the temperature T1 being less than the temperature T2, and the control means can set two different current levels IA and IB of the heating means, the current level IA being greater than the current level IB, and wherein the control means controls the heating means based on the current level IA when the temperature detected by the temperature detection means is less than the temperature T1, and the control means heats the heating means based on the current level IB when the temperature detected by the temperature detection means is equal to or more than the temperature T1 and less than the temperature T2, and the control means turns off the heating means when the temperature detected by the temperature detection means is equal to or more than T2.

* * * * *